United States Patent [19]
Tsukahara et al.

[11] Patent Number: 5,329,468
[45] Date of Patent: Jul. 12, 1994

[54] ACTUAL OPERATING TIME INDICATOR

[75] Inventors: Kazuhito Tsukahara; Hisatsugu Watanabe, both of Yamanashi, Japan

[73] Assignee: Kabushiki Kaisha Kito, Yamanashi, Japan

[21] Appl. No.: 24,727

[22] Filed: Mar. 1, 1993

[30] Foreign Application Priority Data

Mar. 12, 1992 [JP] Japan .................................. 4-53793
Oct. 5, 1992 [JP] Japan ................................ 4-266217

[51] Int. Cl.$^5$ .............................................. G04F 5/00
[52] U.S. Cl. ................................... 364/569; 318/603; 318/569; 377/16; 340/825.65; 324/76.47
[58] Field of Search ................. 364/569, 483; 377/16; 318/603, 569, 573; 324/76, 47, 76, 48; 340/825.65, 825.54

[56] References Cited

U.S. PATENT DOCUMENTS

| | | | |
|---|---|---|---|
| 4,027,470 | 6/1977 | Friedman | 58/39.5 |
| 4,425,538 | 1/1984 | Berney | 318/696 |
| 4,593,237 | 6/1986 | Tanaka | 318/561 |
| 4,870,351 | 9/1989 | Milkovic | 324/142 |

FOREIGN PATENT DOCUMENTS 2-50038  11/1990  Japan .
3-48120  7/1991  Japan .

Primary Examiner—Thomas G. Black
Assistant Examiner—Julie D. Day
Attorney, Agent, or Firm—Pennie & Edmonds

[57] ABSTRACT

An actual operating time indicator includes: a lifting motor for lifting a load up/down; a power detection unit for detecting an input power based on a current and a voltage supplied to the motor, and converting the input power into a first voltage proportional to the input power; a voltage-to-periodic pulse conversion unit connected to the power detection unit for receiving the first voltage and converting the first voltage into the periodic pulse proportional to the first voltage; a counter unit connected to the voltage-to-periodic pulse conversion unit for counting and integrating the periodic pulse to obtain an integrated power; and a display operatively connected to the counter unit for indicating the integrated power as an actual operating time of the motor.

11 Claims, 6 Drawing Sheets

ACTUAL OPERATING TIME INDICATOR

BACKGROUND OF THE INVENTION

1. Field of the Invention

The present invention relates to an actual operating time indicator, more particularly, it relates to an actual operating time indicator for indicating an actual operating time of a hoist apparatus on a digital display. The present invention is advantageously used for an electric hoist apparatus which lifts a load up/down by using a motor, for example, a three-phase induction motor.

2. Description of the Related Art

A hoist apparatus for lifting a load up/down is widely used in various fields, for example, in a factory, a warehouse, construction and the like. There are mainly three types of hoist apparatus from a viewpoint of a motive power source, i.e., a compressed air type, an electric type, and a manual type. Although these types have individual advantages, the electric type is the most popular because this type has various merits from a viewpoint of cost/performance. The present invention relates to the electric hoist apparatus.

In general, an electric hoist apparatus has two motors, i.e., one is a lifting motor for lifting a load up/down, and the other is a travelling motor for moving the hoist apparatus in a traverse direction on a beam. The lifting motor is usually formed by a three-phase induction motor because of a simple/firm structure, relatively low cost and high power.

The lifting motor is defined by at least a rating load indicating a weight of a load in normal use, output power at the rating load, rating time for indicating a range of continuous use time, and a test load for indicating a maximum load.

In the above mentioned various fields, the hoist apparatus may be temporarily used in an overload state or over-time state. Accordingly, it is necessary to obtain precise data which can be utilized for maintenance of the apparatus after use for a certain time period. For example, it is necessary to precisely measure a relationship between a load and an operating time from a start point of use.

There are two main methods for indicating the actual operating time in a conventional art. That is, the actual operating time of the hoist apparatus is displayed by either an integrating wattmeter or a counter. However, the former merely indicates a so-called "total power-on time" for a certain period of time, and the latter merely indicates a number of times the hoist apparatus is operated.

Accordingly, in the above conventional art, the influence of a load during actual use of the hoist apparatus is not considered, for example, in an overload state or over-time state, so that it is impossible to precisely measure the actual operating time while taking the load into consideration.

Further, although the life span of a mechanism varies depending on the load during use, in the conventional art, the relationship between the life span of the mechanism and the load when measuring the actual operating time of the hoist apparatus is not considered. Accordingly, in the conventional art, the data are insufficient for maintenance so that it is impossible to efficiently maintain the hoist apparatus.

SUMMARY OF THE INVENTION

The object of the present invention is to provide an actual operating time indicator enabling precise measurement of an actual operating time of a hoist apparatus, particularly, a lifting motor for lifting a load up/down.

In accordance with one aspect of the present invention, there is provided an actual operating time indicator including: a lifting motor for lifting a load up/down; a power detection unit for detecting an input power based on a current and a voltage supplied to the motor, and converting the input power into a first voltage proportional to the input power; a voltage-to-periodic pulse conversion unit connected to the power detection unit for receiving the first voltage and converting the first voltage into a periodic pulse proportional to the first voltage; a counter unit connected to the voltage-to-periodic pulse conversion unit for counting and integrating the periodic pulse to obtain an integrated power; and a display operatively connected to the counter unit for indicating the integrated power as an actual operating time of the motor.

In a preferred embodiment, the actual operating time indicator further includes a divider connected to the counter unit for dividing the integrated power by a power rating which is equivalent to the input power per unit hour when lifting up a rated load.

In another preferred embodiment, the actual operating time indicator further includes a BCD unit operatively connected to the counter unit for converting a binary number into a decimal number to display the actual operating time on the display unit.

In accordance with another aspect of the present invention, there is provided an actual operating time indicator, including: a lifting motor for lifting a load up/down; a power detection unit for detecting an input power based on a current and a voltage supplied to the motor, converting the input power into a first voltage proportional to the input power, and further converting the first voltage into a second voltage which is converted based on a predetermined formula defined by relationship between a rating load and a life span of a mechanism; a voltage-to-periodic pulse conversion unit connected to the power detection unit for receiving the second voltage and converting the second voltage into the periodic pulse proportional to the second voltage; a counter unit connected to the voltage-to-periodic pulse conversion unit for counting and integrating the periodic pulse to obtain an integrated power; and a display operatively connected to the counter unit for indicating the integrated power as an actual operating time of the motor.

In another embodiment, the predetermined formula is expressed by $Lh \propto (1/P)^n$ where, Lh is a life span of a mechanism, P is a weight of a load, and n is an integer determined by a material of the mechanism.

In still another embodiment, preferably, the integer "n" of the formula is given by a numeral "3" so that the second voltage is determined based on the formula, $$Lh \propto (1/P)^3$$

In still another embodiment, the power detection unit includes an input voltage conversion unit for obtaining the second voltage, and the input voltage conversion unit is formed by: a first calculation unit inputting the first voltage Vb and a rating voltage VaH which is given by the voltage proportional to the rating input power of the lifting motor during the high speed lifting up operation, and calculates the formula $(Vb/VaH)^2$; a second calculation unit inputting the first voltage Vb and a rating voltage VaL which is given by the voltage proportional to the rated input power of the lifting motor during the low speed lifting up operation, and calculates the formula $(Vb/VaL)^2$; the first voltage being given by half of the rating voltage VaH or VaL so that the formula $(Vb/VaH$ or $VaL)^2$ is given by $(\frac{1}{2})^2$; a selector for selecting either an output of the first calculation unit or an output of the second calculation unit; and a third calculation unit inputting the first voltage and either the voltage $(Vb/VaH)^2$ or $(Vb/VaL)^2$, calculating either the formula $(Vb) \times (Vb/VaH)^2$, or $(Vb) \times (Vb/VaL)^2$, and outputting the result of the calculation as the second voltage.

In accordance with still another aspect of the present invention, the actual operating time indicator, includes: a lifting motor for lifting a load up/down; a power detection unit for detecting an input power based on a current and a voltage supplied to the motor, and converting the input power into a first voltage proportional to the input power; a microcomputer connected to the power detection unit for receiving the first voltage and outputting an integrated power; and a display connected to the microcomputer indicating the integrated power as an actual operating time of the motor.

In still another embodiment, the microcomputer includes an analog-to-digital converter, an input port, a central processing unit (CPU), a read only memory (ROM) for storing a basic program for calculation by the CPU, a random access memory (RAM) for temporarily storing a result of the calculation by the CPU, a backup memory, and an output port; wherein, the A/D converter converts the first voltage Vb into a digital value, and further converts a rating voltage VaH or VaL into a digital value;

the CPU calculates the following; first, digitized Vb/VaH or Vb/VaL; second, digitized $(Vb/VaH)^2$ or $(Vb/VaL)^2$ and third, digitized $Vb \times (Vb/VaH)^2$ or $Vb \times (Vb/VaL)^2$;

the CPU counts the result of the calculation and obtains the total number of the count, and divides the total number of the count by a constant (K) which corresponds to an input power rating; and the display indicates the result of the division as the actual operating time; where, the rating voltage (YaH or VaL) is given by the voltage proportional to the rating input power of the lifting motor during the high (low) speed lifting up operation.

DESCRIPTION OF THE PREFERRED EMBODIMENTS

Figure 1:
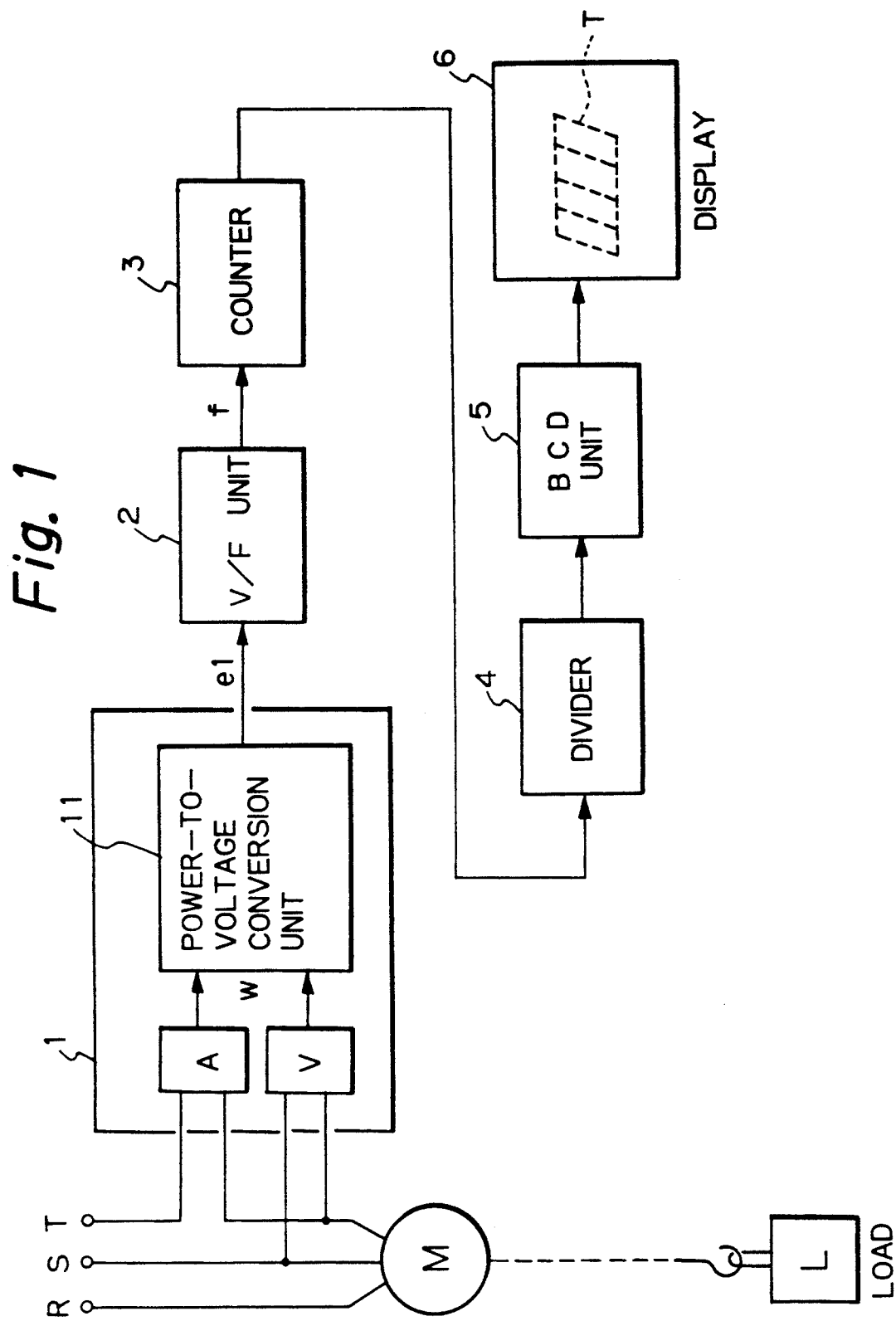
FIG. 1 is a block diagram of an actual operating time indicator according to a first embodiment of the present invention.

FIG. 1 is a block diagram of an actual operating time indicator according to a first embodiment of the present invention. In FIG. 1, "M" denotes a three-phase induction motor used as the lifting motor and operated by AC 200 (v) commercial power. Reference number 1 denotes a power detection unit including an ampere meter A, a volt meter V, and a power-to-voltage conversion unit 11. Reference number 2 denotes a voltage-to-periodic pulse conversion unit V/F, 3 denotes a counter for counting periodic pulses, 4 denotes a divider, 5 denotes a BCD (binary coded decimal) unit, and 6 denotes a display unit for indicating an actual operating time.

As shown in the drawing, the lifting motor M has three phases i.e., "T", "S" and "R" phases. The ampere , meter A is connected in series to the T phase, and the volt meter V is connected in parallel between the T and S phases to detect the current and voltage applied to the lifting motor M.

The power-to-voltage conversion unit 11 is provided for obtaining a first voltage "e1" proportional to an input power W to the lifting motor M. As is known, the input power W of the lifting motor M can be obtained by multiplying the current A by the voltage V and a power-factor since the power is alternating current.

That is, in the power-to-voltage conversion unit 11, the change of the current A is converted to the change of a voltage $V_A$ (not shown) by flowing the current A through a predetermined constant resistor (not shown), and the voltage $V_A$ is multiplied by the voltage V using a known multiplier (not shown) so that it is possible to obtain the voltage "e1" proportional to the input power W to the lifting motor M.

The voltage-to-frequency conversion unit 2 is provided for converting the voltage "e1" from the power-to-voltage conversion unit 11 into a periodic pulse "f". A known digital volt meter utilizes voltage-to-frequency conversion. That is, the digital volt meter counts the periodic pulses to obtain the voltage. This is because that the periodic pulse obtained by the voltage-to-frequency conversion unit is proportional to the measured voltage. Accordingly, the voltage-to-frequency conversion unit 2 outputs a periodic pulse proportional to the input power.

The counter 3 is provided for counting the periodic pulse "f" from the voltage-to-frequency conversion unit 2. Accordingly, the total count of the counter 3 corresponds to the integrated power.

The divider 4 is provided for dividing the integrated power by a power rating. The power rating is equivalent to the power per unit hour (i.e., a unit power) when lifting up a rated load. As a result, since the integrated power is divided by the unit power, it is possible to obtain the "total power-on time" which is converted to the load rating. As is obvious, the "total power-on time" of the above is different from the conventional "power-on time", and it becomes the "total power-on time" taking the use of the hoist apparatus into consideration. Accordingly, it is possible to obtain precise data for maintenance.

The BCD unit 5 is provided for converting the binary 10 number from the divider 4 into a decimal number to display the actual operating time on the display unit 6.

Figure 2:
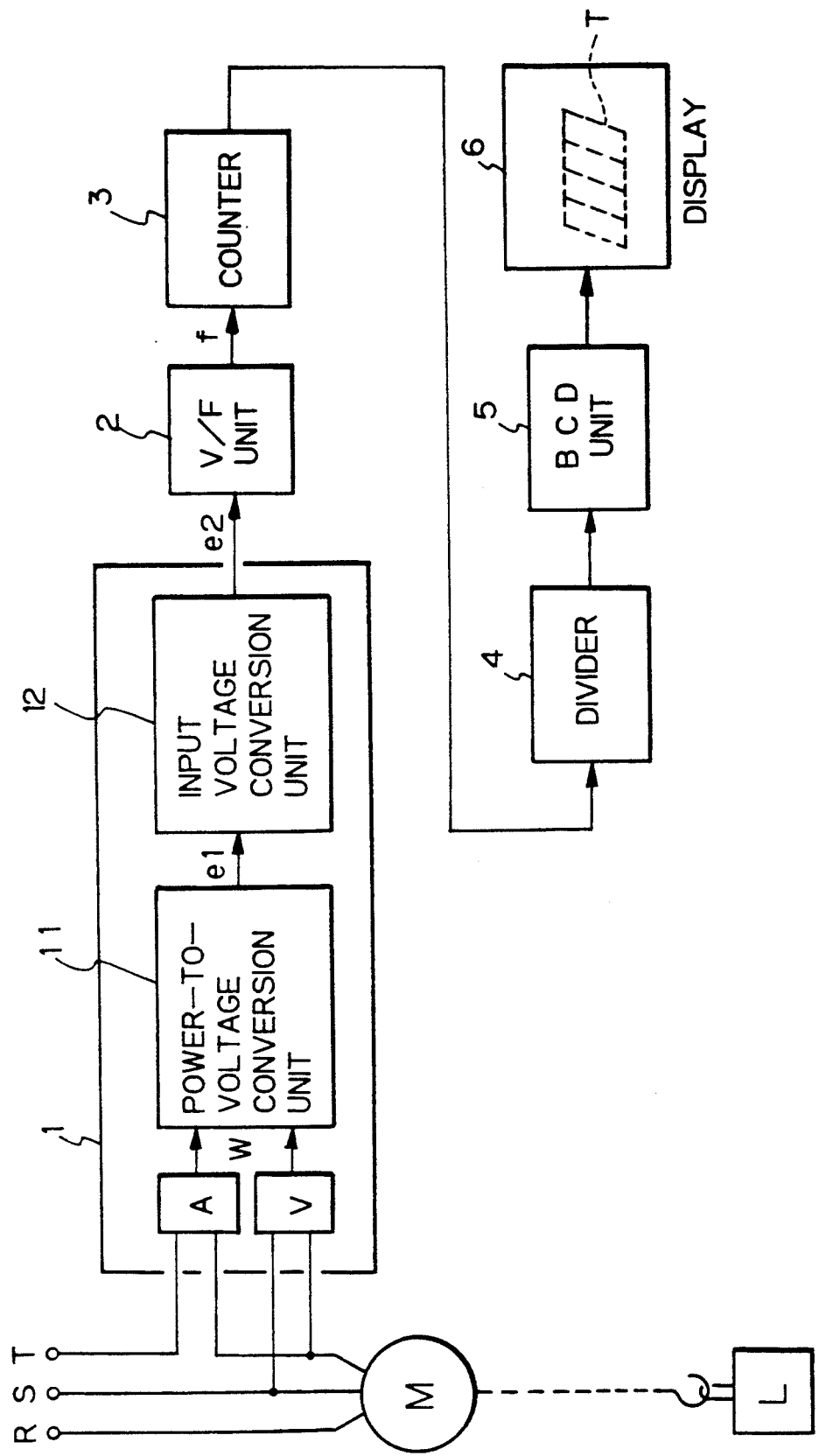
FIG. 2 is a block diagram of an actual operating time indicator according to a second embodiment of the present invention.

FIG. 2 is a block diagram of an actual operating time indicator according to a second embodiment of the present invention. The same reference numbers as used in FIG. 1 are attached to the same components in this drawing. Since the components 2 to 6 have already been explained in relation to FIG. 1, the explanation will be omitted for this drawing.

The power detection unit 1' of this embodiment further includes an input voltage conversion unit 12. The input voltage conversion unit 12 is provided for converting the voltage "e1" into a voltage "e2" taking the life span of the mechanism into consideration as explained in detail below. That is, the voltage "e1" from the power-to-voltage conversion unit 11 is converted to the voltage "e2" based on a predetermined formula indicating the relationship between the load and the life span of the mechanism. Then, the voltage "e2" is sent to the voltage-to-periodic pulse conversion unit 2, and the same processes as explained in relation to FIG. 1 are performed in the components 3 to 6.

The basic concept of the input voltage conversion unit 12 will be explained in detail below. That is, it is known that an element that has the greatest influence on the life span of the mechanism is the weight of the load. Further, in general, the relationship between the load and the life span of the mechanism is expressed by the following formula, $$Lh \propto (1/P)^n \qquad (1)$$

where,
Lh is a life span of a mechanism,
P is a weight of a load, and
n is an integer determined by a material of the mechanism.

The integer "n" is defined in the Japanese Industrial Standard (JIS B 8815 (electric chain-block)) and the European Machine Conveyance Association (FEM). In these documents, the integer "n" is experimentally given by the numeral "3".

When "n" is "3", the formula (1) becomes as follows.

$$Lh \propto (1/P)^3 \qquad (2)$$

Accordingly, the input voltage conversion unit 12 of the present invention is formed based on the formula (2) as explained below.

Figure 3:
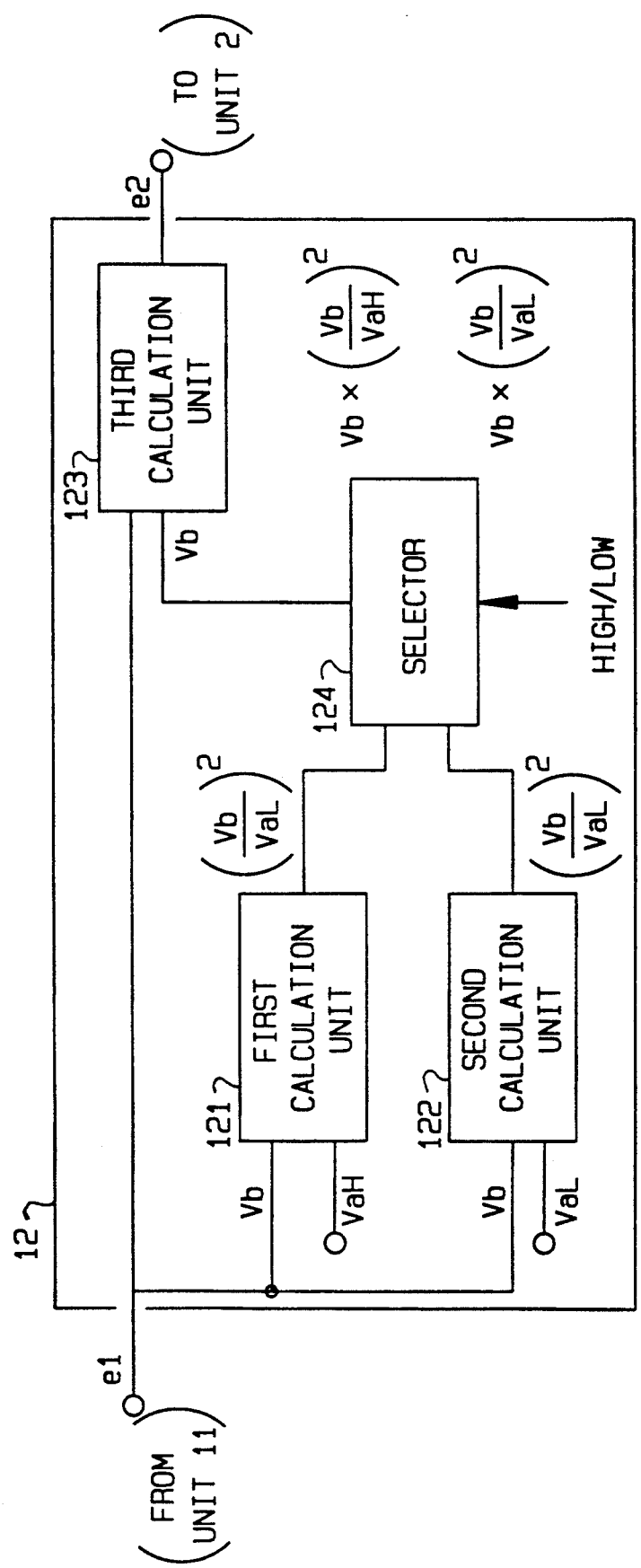
FIG. 3 is a detailed block diagram of an input voltage conversion means shown in FIG. 2.

FIG. 3 is a detailed block diagram of an input voltage conversion unit shown in FIG. 2. In FIG. 3, reference number 121 denotes a first calculation unit, 122 denotes a second calculation unit, 123 denotes a third calculation unit, and 124 denotes a selector.

Further, "H" denotes a high speed lifting operation of the lifting motor M, and "L" denotes a low speed lifting operation of the lifting motor M. In the present invention, the voltage VaH is given by a voltage proportional to the rated input power of the lifting motor at the high speed, and the voltage VaL is given by the voltage proportional to the rated input power of the lifting motor at the low speed. Still further, the voltage Vb corresponds to the voltage "e1" from the power-to-voltage conversion unit 11.

The first calculation unit 121 inputs the voltage Vb and the voltage VaH, and calculates $(Vb/VaH)^2$. In this embodiment, assuming that the voltage Vb is half of the voltage VaH, i.e., Vb=VaH/2, the formula $(Vb/VaH)^2$ is given by $(\frac{1}{2})^2$, i.e., $\frac{1}{4}$.

The second calculation unit 122 inputs the voltage Vb and the voltage VaL, and calculates $(Vb/VaL)^2$. Similarly, in this embodiment, assuming that the voltage Vb is half of the voltage VaL, i.e., Vb=VaL/2, the formula $(Vb/VaL)^2$ is given by $(\frac{1}{2})^2$, i.e., $\frac{1}{4}$.

The selector 124 is provided for selecting either the high speed or the low speed (HIGH/LOW) of the lifting up/down operation. In general, this selector is switched by an operator from a control box shown in FIG. 6. As shown in the drawing, the selector switches either the output of the first calculation unit 121 or the output of the second calculation unit 122.

The third calculation unit 123 inputs the voltage Vb and either the voltage $(Vb/VaH)^2$ or $(Vb/VaL)^2$, and calculates the following formula.

$$(Vb) \times (Vb/VaH)^2, \text{ or} \qquad (3)$$

$$(Vb) \times (Vb/VaL)^2 \qquad (4)$$

As mentioned above, when Vb=YaH (VaL)/2 the formula (3) is given by $VaH \times (\frac{1}{2})^3$, and the formula (4) is given by $VaL \times (\frac{1}{2})^3$.

As is obvious, the numeral "3" of the above corresponds to the integer "n" of the formula (1).

This means that, in the first embodiment in FIG. 1, although the input power having half of the rated power is converted to a voltage, in the second embodiment in FIG. 2, first, the input power having half of the rated power is converted to $\frac{1}{8}$ of the rated power, then the converted input power is converted to the voltage "e2" proportional to the converted input power.

Accordingly, in the second embodiment, it is possible to obtain the actual operating time taking the actual use of the hoist apparatus into consideration.

Figure 4:
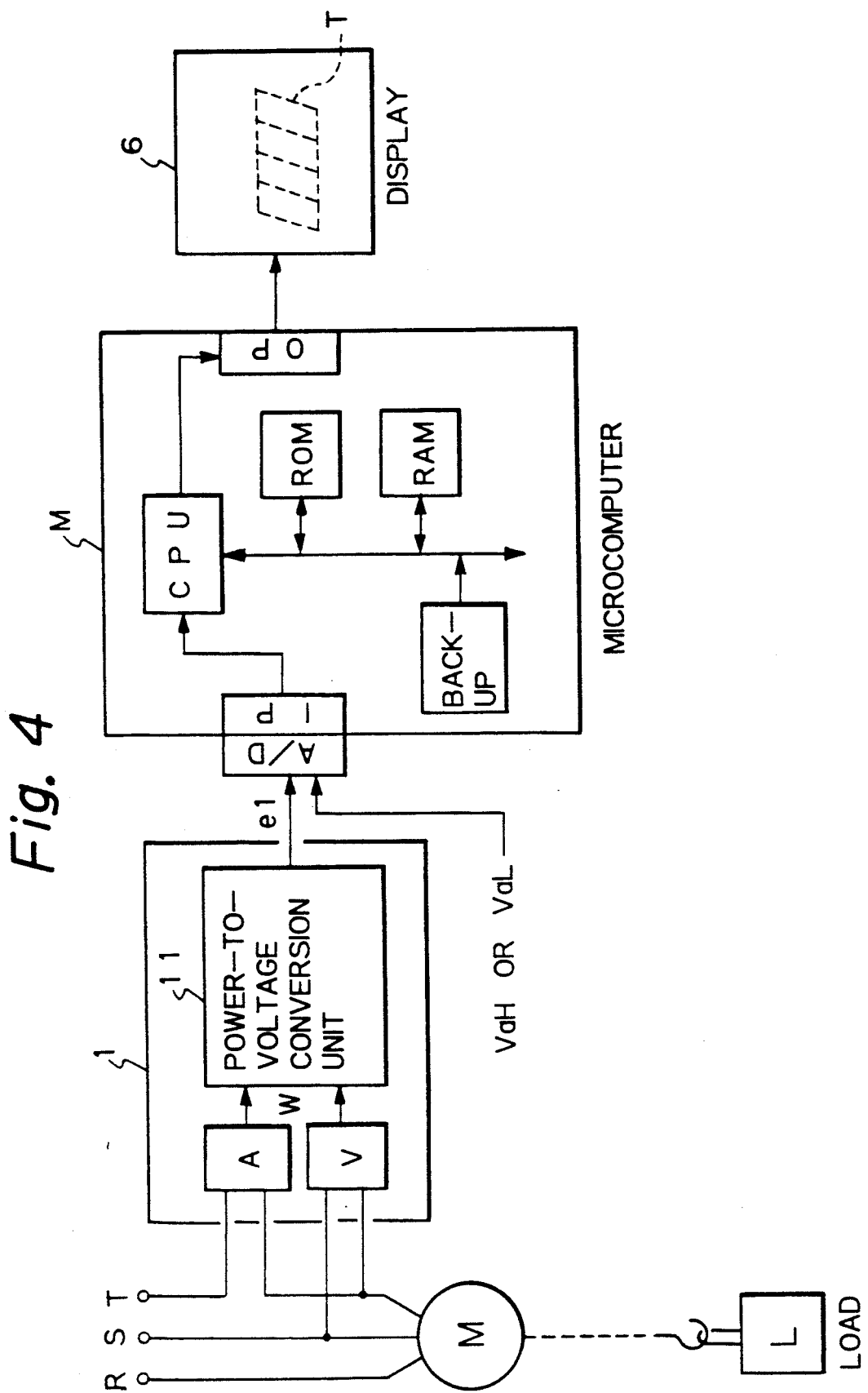
FIG. 4 is another block diagram of an actual operating time indicator shown in FIG. 2.

FIG. 4 is another block diagram of an actual operating time indicator shown in FIG. 2. The same reference numbers as used in FIGS. 1 and 2 are attached to the same components in this drawing. "M" denotes a microcomputer. The microcomputer M includes an analog-to-digital converter (A/D), an input port (IP), a central processing unit (CPU), a read only memory (ROM), a random access memory (RAM), a backup memory, and an output port (OP). Based on these components, the microcomputer has functions of the input voltage conversion unit 12, the counter 3, the divider 4 and the BCD unit 5. The ROM stores a basic program for the calculation by the CPU, and the RAM temporarily stores the result of the calculation by the CPU. The backup memory has a backup function for the RAM. The input port and the output port are provided as terminals. The operation of the CPU is shown in FIG. 5.

Figure 5:
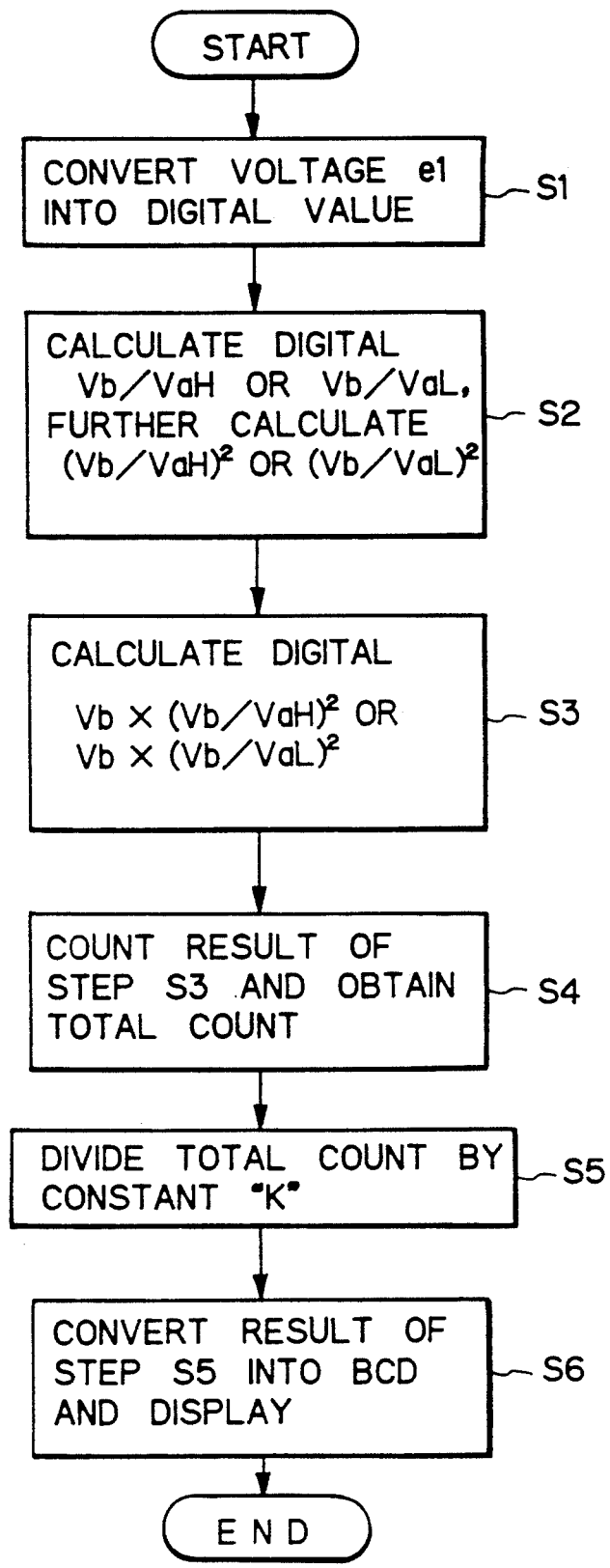
FIG. 5 is a flowchart for explaining an operation of a structure of FIG. 4.

FIG. 5 is a flowchart for explaining an operation of the structure of FIG. 4. In step S1, the A/D converter converts the voltage "e1" (Vb) from the power-to-voltage conversion unit 11 into a digital value, and further converts the voltage VaH or the voltage VaL into a digital value. In step S2, the CPU calculates digitized Vb/VaH (or, Vb/VaL), and further calculates digitized $(Vb/VaH)^2$ (or, $(Vb/VaL)^2$). In step S3, the CPU calculates digitized $Vb \times (Vb/VaH)^2$ (or, $Vb \times (Vb/VaL)^2$). In step S4, the CPU counts the result of the above calculation of the step S4 and obtains the total number of the count. In step S5, the CPU divides the total number of the count by a constant K. The constant K corresponds to the rated input power explained in relation to the divider 4. That is, this calculation corresponds to that of the divider 4 in FIG. 2. In step S6, the display 6 indicates the result of the division as the actual operating time.

Figure 6:
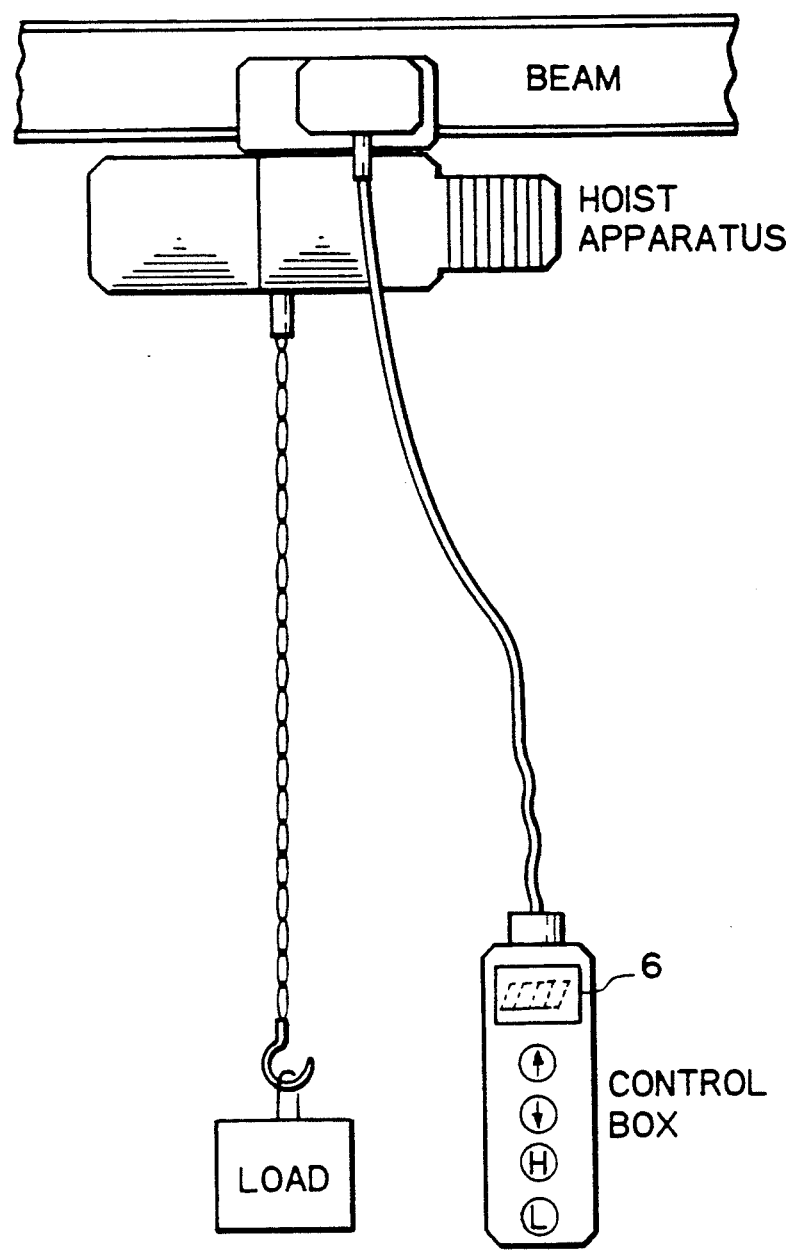
FIG. 6 is a schematic view of a hoist apparatus and a control box including an actual operating time indicator according to the present invention.

FIG. 6 is a schematic view of a hoist apparatus and a control box including an actual operating time indicator according to the present invention. As explained above, the electric hoist apparatus has two motors, i.e., the lifting motor for lifting a load up/down and the travelling motor for moving the hoist apparatus toward the traverse direction of the beam. The control box has selection buttons, i.e., "up", "down", "high" and "low" each of which is manually operated by an operator. Further, the control box includes the display used as the actual operating time indicater according to the present invention.

We claim:

1. An actual operating time indicator, comprising:
   a lifting motor (M) for lifting a load (L) up/down;
   a power detection means (1) for detecting an input power (W) based on a current (A) and a voltage (V) supplied to the motor (M), and converting the input power (W) into a first voltage (e1) proportional to the input power (W);
   a voltage-to-periodic pulse conversion means (2) connected to the power detection means (1) for receiving the first voltage (e1) and converting the first voltage (e1) into the periodic pulse (f) proportional to the first voltage (e1);
   a counter means (3) connected to the voltage-to-periodic pulse conversion means (2) for counting and integrating the periodic pulse (f) to obtain an integrated power; and
   a display (6) operatively connected to the counter means (3) for indicating the integrated power as an actual operating time (T) of the motor (M).

2. An actual operating time indicator as claimed in claim 1, further comprising a divider (4) connected to the counter means (3) for dividing the integrated power by a power rating which is equivalent to the input power per unit hour when lifting up a rated load.

3. An actual operating time indicator as claimed in claim 1, further comprising a BCD unit (5) operatively connected to the counter means (3) for converting a binary number into a decimal number to display the actual operating time (T) on the display unit (6).

4. An actual operating time indicator, comprising:
   a lifting motor (M) for lifting a load (L) up/down;
   a power detection means (1') for detecting an input power (W) based on a current (A) and a voltage (V) supplied to the motor (M), converting the input power (W) into a first voltage (e1, Vb) proportional to the input power (W), and further converting the first voltage (e1) into a second voltage (e2) which is converted based on a predetermined formula defined by a relationship between a rated load and a life span of a mechanism;
   a voltage-to-periodic pulse conversion means (2) connected to the power detection means (1') for receiving the second voltage (e2) and converting the second voltage (e2) into the periodic pulse (f) proportional to the second voltage (e2);
   a counter means (3) connected to the voltage-to-periodic pulse conversion means (2) for counting and integrating the periodic pulses (f) to obtain an integrated power; and
   a display (6) operatively connected to the counter means (3) for indicating the integrated power as an actual operating time (T) of the motor (M).

5. An actual operating time indicator as claimed in claim 4, further comprising a divider (4) connected to the counter means (3) for dividing the integrated power by a power rating which is equivalent to the power per unit hour when lifting up a rated load.

6. An actual operating time indicator as claimed in claim 4, further comprising a BCD unit (5) operatively connected to the counter means (3) for converting a binary number into a decimal number to display the actual operating time on the display unit (6).

7. An actual operating time indicator as claimed in claim 4, wherein the predetermined formula is expressed by $Lh \propto (1/P)^n$ where, Lh is a life span of a mechanism, P is a weight of a load, and n is an integer determined by a material of the mechanism.

8. An actual operating time indicator as claimed in claim 7, wherein, preferably, the integer "n" of the formula is given by a numeral "3" so that the second voltage (e2) is determined based on the formula, $$Lh \propto (1/P)^3$$

9. An actual operating time indicator as claimed in claim 4, wherein the power detection means (1') includes an input voltage conversion unit (12) for obtaining the second voltage (e2), and the input voltage conversion unit (12) comprises:
   a first calculation unit (121) inputting the first voltage (Vb) and a rated voltage (VaH) which is given by the voltage proportional to the rated input power of the lifting motor at the high speed lifting operation, and calculating the formula $(Vb/VaH)^2$;
   a second calculation unit (122) inputting the first voltage (Vb) and a rated voltage (VaL) which is given by the voltage proportional to the rated input power of the lifting motor at the low speed lifting operation, and calculating the formula $(Vb/VaL)^2$;
   a selector (124) for selecting either an output of the first calculation unit (121) or an output of the second calculation unit (122); and
   a third calculation unit (123) inputting the first voltage (Vb) and either the voltage $(Vb/VaH)^2$ or $(Vb/VaL)^2$ calculating either the formula $(Vb) \times (Vb/VaH)^2$, or $(Vb) \times (Vb/VaL)^2$, and outputting the result of the above calculation as the second voltage (e2).

10. An actual operating time indicator, comprising:
    a lifting motor (M) for lifting a load (L) up/down;
    a power detection means (1) for detecting an input power (W) based on a current (A) and a voltage (V) supplied to the motor (M), and converting the input power (W) into a first voltage (e1) proportional to the input power (W);
    a microcomputer (M) connected to the power detection means (1) for receiving the first voltage (e1) and outputting an integrated power; and
    a display (6) connected to the microcomputer (M) indicating the integrated power as an actual operating time (T) of the motor (M).

11. An actual operating time indicator as claimed in claim 10, wherein the microcomputer (M) includes an analog-to-digital converter (A/D), an input port, a central processing unit (CPU), a read only memory (ROM) for storing a basic program for calculation by the CPU, a random access memory (RAM) temporarily storing a result of the calculation by the CPU, a backup memory, and an output port;

wherein, the A/D converter converts the first voltage (e1, Vb) into a digital value, and further converts a rated voltage (VaH or VaL) into a digital value;

the CPU calculates the following; first, digitized Vb/VaH or Vb/VaL; second, digitized $(Vb/VaH)^2$ or $(Vb/VaL)^2$, and third, digitized $Vb \times (Vb/VaH)^2$ or $Vb \times (Vb/VaL)^2$;

the CPU counts the result of the calculation and obtains the total number of the count, and divides the total number of the count by a constant (K) which corresponds to a rated input power; and the display (6) indicates the result of the division as the actual operating time (T);

where, the rated voltage (VaH or VaL) is given by the voltage proportional to the rated input power of the lifting motor during the high (low) speed lifting operation.

* * * * *